United States Patent
Watanabe et al.

(10) Patent No.: US 9,852,922 B2
(45) Date of Patent: Dec. 26, 2017

(54) PLASMA PROCESSING METHOD

(71) Applicant: Tokyo Electron Limited, Tokyo (JP)

(72) Inventors: Hikaru Watanabe, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/283,703

(22) Filed: Oct. 3, 2016

(65) Prior Publication Data

US 2017/0092509 A1 Mar. 30, 2017

Related U.S. Application Data

(62) Division of application No. 14/347,033, filed as application No. PCT/JP2012/006086 on Sep. 25, 2012, now abandoned.
(Continued)

(30) Foreign Application Priority Data

Sep. 26, 2011 (JP) .................. 2011-209133

(51) Int. Cl.
*H01L 21/302* (2006.01)
*H01L 21/461* (2006.01)
(Continued)

(52) U.S. Cl.
CPC .. *H01L 21/31116* (2013.01); *H01J 37/32009* (2013.01); *H01J 37/3244* (2013.01);
(Continued)

(58) Field of Classification Search
USPC ...................................... 438/714
See application file for complete search history.

(56) References Cited

U.S. PATENT DOCUMENTS

2006/0066247 A1 3/2006 Koshiishi
2008/0236750 A1 10/2008 Koshimizu
(Continued)

FOREIGN PATENT DOCUMENTS

JP 11176803 A 7/1999
JP 2002110650 A 4/2002
(Continued)

OTHER PUBLICATIONS

International Search Report from International Application No. PCT/JP12/06086 dated Nov. 6, 2012.
(Continued)

*Primary Examiner* — Roberts Culbert
(74) *Attorney, Agent, or Firm* — Brundidge & Stanger, P.C.

(57) ABSTRACT

A plasma etching method includes: mounting a target substrate on a first electrode which is provided to be parallel with a second electrode with a preset gap within a processing chamber, a base material of the second electrode containing silicon or SiC; generating plasma of a fluorocarbon-based etching gas in a processing space; applying a low frequency AC power or a high frequency AC power having a frequency, which an ion in the plasma is allowed to follow, to the second electrode; and increasing an effective voltage value of the AC power to enhance sputtering at the second electrode such that silicon sputtered from the base material reacts with fluorine radicals generated from the fluorocarbon-based etching gas to produce a reaction product of $SiF_4$, to irradiate electrons generated near the second electrode to the target substrate and to increase a plasma potential near a sidewall of the processing chamber.

3 Claims, 14 Drawing Sheets

Related U.S. Application Data

(60) Provisional application No. 61/544,331, filed on Oct. 7, 2011.

(51) Int. Cl.

| | | |
|---|---|---|
| *H01L 21/311* | (2006.01) | |
| *H01J 37/32* | (2006.01) | |
| *H01L 21/3065* | (2006.01) | |
| *H01L 21/67* | (2006.01) | |
| *H01L 21/768* | (2006.01) | |

(52) U.S. Cl.
CPC .. *H01J 37/32091* (2013.01); *H01J 37/32165* (2013.01); *H01J 37/32532* (2013.01); *H01L 21/3065* (2013.01); *H01L 21/31144* (2013.01); *H01L 21/67069* (2013.01); *H01L 21/76802* (2013.01); *H01L 21/76816* (2013.01); *H01L 21/76877* (2013.01); *H01J 2237/334* (2013.01)

(56) References Cited

U.S. PATENT DOCUMENTS

| | | |
|---|---|---|
| 2010/0220081 A1 | 9/2010 | Yatsuda |
| 2012/0115257 A1 | 5/2012 | Matsuyama et al. |

FOREIGN PATENT DOCUMENTS

| | | |
|---|---|---|
| JP | 2006270019 A | 10/2006 |
| JP | 2006286791 A | 10/2006 |
| JP | 2006286813 A | 10/2006 |
| JP | 2007317889 A | 12/2007 |
| JP | 2009099858 A | 5/2009 |
| JP | 2009267352 A | 11/2009 |
| WO | 2010100702 A1 | 9/2010 |

OTHER PUBLICATIONS

U.S. Appl. No. 14/347,033 Non-final Office Action dated Oct. 21, 2015, 5 pages.

U.S. Appl. No. 14/347,033 Final Office Action dated May 9, 2016, 9 pages.

*FIG. 8*

| UPPER ELECTRODE APPLYING MANNER | DC | | | AC (380kHz) | | |
|---|---|---|---|---|---|---|
| VOLTAGE (POWER) | 150 v | 300 v | 450 v | 250 w | 500 w | 1000 w |
| TOP CD / BOWING CD / SEM IMAGE | | | | | | |
| MASK SELECTIVITY | 4.3 | 4.7 | 4.8 | 4.6 | 5.1 | 5.4 |
| BOWING AMOUNT (BOWING CD - TOP CD) | 33nm | 27nm | 22nm | 41nm | 30nm | 28nm |

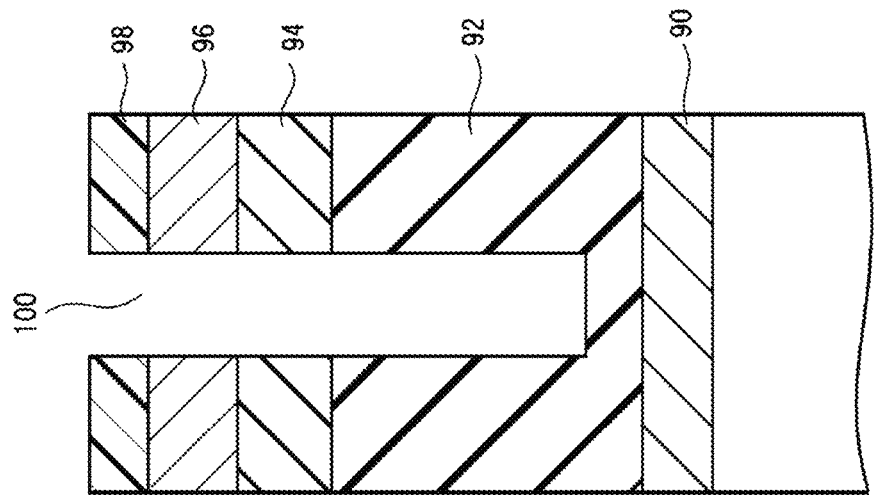
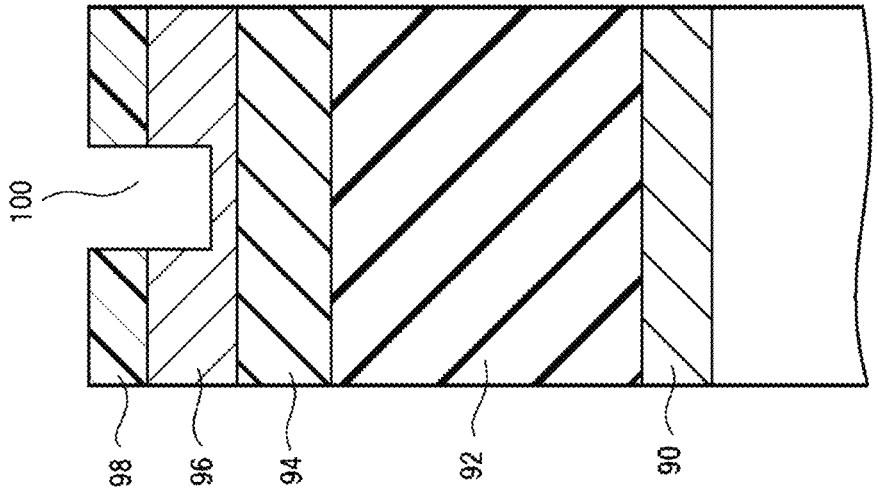

FIG. 11

| UPPER ELECTRODE APPLYING MANNER | 0V | DC | | AC (380kHz) | |
|---|---|---|---|---|---|
| VOLTAGE/POWER | 0V | -300V | -700V | 280W | 500W |
| SEM IMAGE PRIOR TO HF PROCESS | | | | | |
| ETCHING DEPTH | 141nm | 160nm | 156nm | 150nm | 153nm |
| TOP CD | 54nm | 47nm | 41nm | 45nm | 44nm |
| BOWING CD | 55nm | 49nm | 41nm | 46nm | 44nm |
| SEM IMAGE AFTER HF PROCESS | | | | | |
| BOWING CD | 55nm | 53nm | 52nm | 51nm | 62nm |
| LOW-K DAMAGE AMOUNT | 0nm | 4nm | 11nm | 5nm | 18nm |
| $N_e$ ~ LOWER ELECTRODE $V_L$ | 3.0E+10 / 380V | 4.4E+10 / 370V | 5.5E+10 / 280V | 4.0E+10 / 300V | 4.9E+10 / 240V |

FIG. 12

| UPPER ELECTRODE APPLYING MANNER | | DC | | | AC (380kHz) | |
|---|---|---|---|---|---|---|
| VOLTAGE/POWER | 0V | -300V | -700V | 250W | 500W |
| SEM IMAGE PRIOR TO HF PROCESS | | | | | | |
| ETCHING DEPTH | 162nm | 155nm | 170nm | 150nm | 163nm |
| TOP CD | 52nm | 51nm | 41nm | 46nm | 42nm |
| BOWING CD | 52nm | 51nm | 41nm | 46nm | 42nm |
| SEM IMAGE AFTER HF PROCESS | | | | | | |
| BOWING CD | 53nm | 53nm | 53nm | 51nm | 61nm |
| LOW-K DAMAGE AMOUNT | 1nm | 2nm | 12nm | 5nm | 19nm |
| 40MHz+13MHz POWER | 930+0W | 760+50W | 270+300W | 630+160W | 270+430W |

DEPENDENCE OF $N_e$ - LOWER ELECTRODE $V_L$ CHARACTERISTIC ON UPPER ELECTRODE DC POWER

DEPENDENCE OF $N_e$ - LOWER ELECTRODE $V_L$ CHARACTERISTIC ON UPPER ELECTRODE AC POWER

*FIG. 18*

| DC | 0V | −300V | −700V |
|---|---|---|---|
| SEM IMAGE | | | |
| THICKNESS OF MODIFICATION LAYER | 16.7nm | 21.4nm | 40.8nm |
| UPPER ELECTRODE $V_{dc}$ | 0V | 300V | 700V |
| LOWER ELECTRODE $V_L$ | 78V | 77V | 70V |

| AC (380kHz) | 0W | 250W | 500W |
|---|---|---|---|
| SEM IMAGE | | | |
| THICKNESS OF MODIFICATION LAYER | 16.7nm | 26.6nm | 50.6nm |
| UPPER ELECTRODE $V_B$ | 0V | 277V | 494V |
| LOWER ELECTRODE $V_L$ | 78V | 58V | 48V |

PLASMA PROCESSING METHOD

CROSS-REFERENCE TO RELATED APPLICATION

This is a divisional application of U.S. patent application Ser. No. 14/347,033, filed on Mar. 25, 2014 which is a U.S. national phase application under 35 U.S.C. §371 of PCT Application No. PCT/JP2012/006086 filed on Sep. 25, 2012, which claims the benefit of Japanese Patent Application No. 2011-209133 filed on Sep. 26, 2011, and U.S. Provisional Application Ser. No. 61/544,331 filed on Oct. 7, 2011, the entire disclosures of which are incorporated herein by reference.

TECHNICAL FIELD

The embodiments described herein pertain generally to a plasma process performed in microprocessing a target substrate such as a semiconductor wafer or the like, and particularly, to plasma processing method.

BACKGROUND ART

In a process such as etching, deposition, oxidation, and sputtering in a manufacturing process of a semiconductor device or a FPD (Flat Panel Display), plasma has been widely used to carry out a sufficient reaction to a processing gas at a relatively low temperature. In such plasma processes, a high frequency power (RF) or a microwave power has been used to electrically discharge or ionize a processing gas within a vacuum processing chamber.

In a capacitively coupled plasma processing apparatus using a high frequency power (RF), an upper electrode and a lower electrode are arranged to be parallel with each other within a processing chamber, a target substrate (a semiconductor wafer, a glass substrate, or the like) is typically mounted on the lower electrode, and a high frequency power having a frequency (typically, about 13.56 MHz or more) suitable for plasma generation is applied to the upper electrode or the lower electrode. Due to a high frequency electric field generated between the two electrodes facing each other by applying the high frequency power, electrons are accelerated, and due to ionization by collision between the electrons and a processing gas, plasma is generated. Further, due to a gas phase reaction or a surface reaction of radicals or ions in the plasma, a thin film is deposited on the substrate, or a material of the substrate or a thin film on a surface of the substrate is etched.

Recently, as a technology of rapidly increasing performance in a capacitively coupled plasma processing apparatus, a technology of applying a negative DC (Direct Current) voltage to a facing electrode (typically, an upper electrode) that faces a substrate with a processing space therebetween has attracted attention (Patent Document 1). This upper electrode DC power applying manner has at least one of the following effects: (1) the effect of enhancing sputtering at the upper electrode by increasing an absolute value of a self-bias voltage of the upper electrode; (2) the effect of reducing generated plasma by expanding a plasma sheath at the upper electrode; (3) the effect of irradiating electrons generated near the upper electrode to the target substrate; (4) the effect of controlling a plasma potential; (5) the effect of increasing an electron density (plasma density); and (6) the effect of increasing a plasma density at a central portion thereof.

REFERENCES

Patent Document 1: Japanese Patent Laid-open Publication No. 2006-270019

DISCLOSURE OF THE INVENTION

Problems to be Solved by the Invention

The upper electrode DC power applying manner as described above has often been used in a HARC (High Aspect Ratio Contact) process. The HARC process is to form a narrow and deep contact hole or via hole in an oxide film (typically, a silicon oxide film) of an insulating layer by the plasma etching during a wiring forming process for manufacturing a LSI. In the HARC process, in order to form a fine hole of a high aspect ratio, an anisotropic profile of high precision and high selectivity with respect to a mask and an underlying film may be required, a fluorocarbon-based gas may be used as an etching gas, and a silicon-containing material such as silicon or SiC may be used as a base material of an upper electrode.

According to the upper electrode DC power applying manner, based on the above-described effects (1) and (3), anisotropy and selectivity can be greatly improved. To be more specific, due to the effect (1), deposits (mainly, fluorocarbon polymerized film) sputtered on a surface of the upper electrode are deposited on a surface of a resist mask, so that a surface of the resist mask can be suppressed from being roughened. Further, silicon sputtered from the base material of the upper electrode reacts with fluorine radicals, so that a highly volatile reaction product ($SiF_4$) is produced and then exhausted. Therefore, it is possible to reduce fluorine that lowers anisotropy and selectivity (fluorine scavenging effect). Furthermore, due to the effect (3), electrons of high energy are introduced to the resist mask on the surface of the substrate, so that a composition of a surface layer of the resist mask is modified and etching resistance (plasma resistance) is enhanced.

However, in the HARC process, if an absolute value of a negative DC voltage to be applied to the upper electrode in the upper electrode DC power applying manner is increased, such microprocessing property (particularly, selectivity) is improved but a process uniformity (particularly, etching rate in-plane uniformity) is deteriorated, which is a problem.

Further, due to the effect (4) of the upper electrode DC power applying manner, a plasma potential is controlled to be reduced. That is, as an absolute value of a negative DC voltage to be applied to the upper electrode is increased in order to obtain any one of the other effects (1) to (3), (5), and (6) as desired, a plasma potential near a sidewall of the chamber is decreased. Accordingly, the effect of removing deposits attached to the sidewall of the chamber by the sputtering through the ion irradiation is reduced. This is also a problem.

In order to solve the above-described problems of the conventional technologies, example embodiments provide a plasma processing apparatus and a plasma processing method capable of maintaining advantages of an upper electrode DC power applying manner and removing disadvantages of the upper electrode DC power applying manner.

Means for Solving the Problems

In one example embodiment, a plasma processing apparatus includes a processing chamber allowed to be vacuum exhausted; a first electrode that is provided within the processing chamber and configured to mount and support thereon a target substrate; a second electrode that is provided to be parallel with the first electrode with a preset gap within the processing chamber; a processing gas supply unit configured to supply a predetermined processing gas into a processing space between the first electrode and the second electrode within the processing chamber; a first high frequency power supply configured to apply a first high frequency power having a frequency for electrically discharging the processing gas and generating plasma to the first electrode; an AC power supply configured to apply a low frequency or a high frequency AC power having a frequency, which an ion in the plasma is allowed to follow, to the second electrode; and a blocking capacitor connected between the AC power supply and the second electrode.

In the above-described configuration, if the AC power is applied to the second electrode from the AC power supply via the blocking capacitor during a plasma process, a negative DC voltage, i.e. a self-bias voltage, is generated in the second electrode and the self-bias voltage is overlapped with an AC voltage (instantaneous value). That is, an electric potential of the second electrode is cyclically changed since the self-bias voltage is overlapped with the AC voltage level (instantaneous value). Thus, ion energy of ions, which follows a frequency of the AC power and incident to the upper electrode from the plasma, is proportional to a depth (absolute value) in a direction of a negative electric potential of the second electrode and is cyclically changed. Therefore, during each cycle, when the AC voltage level has the minimum value, the ion energy has the maximum value, whereas when the AC voltage level has the maximum value, the ion energy has the minimum value. In this case, as for an ion energy distribution, since a lot of ions are incident to the electrode at a time range (near the maximum or minimum level) in which a voltage change over time is small, a lot of ions are distributed near the maximum ion energy level or the minimum ion energy level.

Further, if the frequency of the AC power applied to the second electrode is higher than an ion plasma frequency, a follow-up property of the ions is decreased. Further, as the frequency of the AC power is increased, a width of an energy band in the ion energy distribution is narrowed. That is, a deviation of the ion energy is decreased and the ion energy is distributed almost near a central value corresponding to the self-bias voltage. Thus, the maximum value of the ion energy is decreased.

Typically, there is a relationship of $SY \propto E_i^{1/2}$ between ion energy ($E_i$) and a sputtering yield (SY). Therefore, the sputtering yield largely depends on the magnitude (maximum value) of the ion energy rather than the number of incident ions. In this regard, even if amplitudes or absolute values of a power supply voltage applied to the second electrode are the same, since the maximum ion energy of ions incident to the second electrode is remarkably high in the manner (upper electrode AC power applying manner) of the example embodiment as compared with the conventional upper electrode DC power applying manner, the AC power applying manner of the example embodiment can improve the sputtering yield at the second electrode with more efficiency.

Furthermore, according to the upper electrode AC power applying manner of the example embodiment, in a half cycle where the AC voltage level has a positive value, an electric potential of the second electrode is higher than the self-bias voltage, so that the plasma potential is increased accordingly. Therefore, the plasma potential near the sidewall of the chamber is increased in a time-average manner. Thus, the sputtering effect of removing deposits attached to the sidewall of the chamber can be improved, and the deposits on the sidewall of the chamber can be efficiently removed.

In another example embodiment, a plasma etching method of forming a hole of a high aspect ratio in a silicon oxide film on a target substrate includes: mounting and supporting the target substrate on a first electrode within a processing chamber in which the first electrode is provided to be parallel with a second electrode with a preset gap, a base material of the second electrode containing silicon or SiC; vacuum exhausting an inside of the processing chamber to a preset pressure; generating plasma of a fluorocarbon-based etching gas in a processing space between the first electrode and the second electrode by supplying the etching gas into the processing space and applying a first high frequency power to the first electrode; applying a low frequency AC power or a high frequency AC power having a frequency, which an ion in the plasma is allowed to follow, to the second electrode via a blocking capacitor; and increasing an effective voltage value of the AC power of the AC power supply to enhance sputtering at the second electrode by increasing an absolute value of a self-bias voltage of the second electrode such that silicon sputtered from the base material of the second electrode reacts with fluorine radicals generated from the fluorocarbon-based etching gas to produce a reaction product of $SiF_4$, to irradiate electrons generated near the second electrode to the target substrate and to increase a plasma potential near a sidewall of the processing chamber.

According to the plasma etching method of the example embodiment, since the above-described upper electrode AC power applying manner is used, it is possible to improve in-plane uniformity in etching rates while obtaining mask selectivity equivalent to that of the conventional upper electrode DC power applying manner.

Effect of the Invention

In accordance with the example embodiment, with the above-described configuration and operation, it is possible to maintain advantages of a conventional upper electrode DC power applying manner and also possible to remove disadvantages of the upper electrode DC power applying manner.

BRIEF DESCRIPTION OF THE DRAWINGS

FIG. 8 shows etching profiles (SEM images) obtained from a HARC process experiment in accordance with an experimental example.

FIG. 10A and FIG. 10B are diagrams for explaining a BEOL process in accordance with an experimental example.

FIG. 11 shows cross sectional views (SEM images) of patterns obtained from a first experiment of the BEOL process in accordance with the experimental example and measurement values of measurement items.

FIG. 12 shows cross sectional views (SEM images) of patterns obtained from a second experiment of the BEOL process in accordance with the experimental example and measurement values of measurement items.

FIG. 18 shows experimental results (SEM images) of an ArF resist modifying process in the upper electrode AC power applying manner and the upper electrode DC power applying manner.

MODE FOR CARRYING OUT THE INVENTION

Hereinafter, example embodiments will be explained with reference to the accompanying drawings.

(Configuration of Plasma Processing Apparatus)

Figure 1:
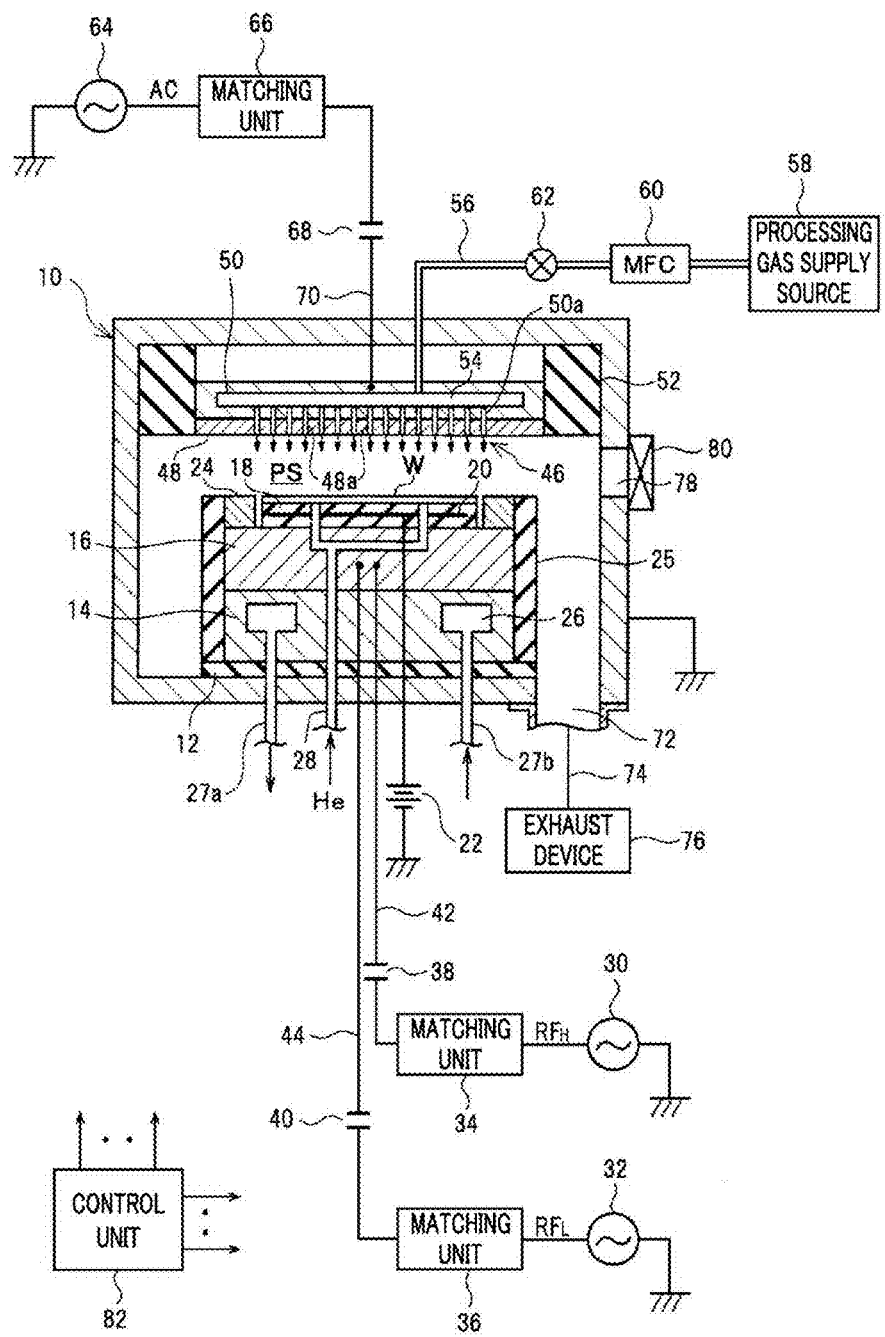
FIG. 1 is a longitudinal cross sectional view showing a configuration of a capacitively coupled plasma etching apparatus in accordance with an example embodiment.

FIG. 1 shows a configuration of a plasma processing apparatus in accordance with an example embodiment. The plasma processing apparatus is configured as a capacitively coupled (parallel plate type) plasma etching apparatus, in which dual high frequency powers are applied to a lower electrode. Further, the plasma processing apparatus includes a cylindrical vacuum chamber (processing chamber) 10 made of, for example, aluminum of which a surface is alumite treated (anodically oxidized). The chamber 10 is grounded.

At a bottom portion of the chamber 10, a cylindrical susceptor supporting member 14 is provided via an insulating plate 12 such as ceramic, and a susceptor 16 made of, for example, aluminum is provided on the susceptor supporting member 14. The susceptor 16 constitutes a lower electrode, and a target substrate such as a semiconductor wafer W is mounted thereon.

On an upper surface of the susceptor 16, there is provided an electrostatic chuck 18 configured to hold the semiconductor wafer W. This electrostatic chuck 18 includes an electrode 20 made of a conductive film to be interposed between a pair of insulating layers or insulating sheets. The electrode 20 is electrically connected to a DC power supply 22. The semiconductor wafer W can be held on the electrostatic chuck 18 by an electrostatic attracting force caused by a DC voltage from the DC power supply 22. Around the electrostatic chuck 18 on the upper surface of the susceptor 16, there is provided a focus ring 24 made of, for example, silicon and configured to improve etching uniformity. At side surfaces of the susceptor 16 and the susceptor supporting member 14, a cylindrical inner wall member 25 made of, for example, quartz is provided.

Within the susceptor supporting member 14, there is formed a coolant path 26 extending, for example, along a circumference thereof. Through this coolant path 26, a coolant such as cooling water having a certain temperature is circulated and supplied from an external chiller unit (not illustrated) through lines 27a and 27b. A process temperature of the semiconductor wafer W on the susceptor 16 is controlled according to a temperature of the coolant. A heat transfer gas such as a He gas is supplied between an upper surface of the electrostatic chuck 18 and a rear surface of the semiconductor wafer W from a heat transfer gas supply device (not illustrated) through a gas supply line 28.

The susceptor 16 is electrically connected to first and second high frequency power supplies 30 and 32 via matching units 34 and 36, blocking capacitors 38 and 40, and power supply rods 42 and 44, respectively. Further, although the power supply rods 42 and 44 are separately illustrated in FIG. 1, the power supply rods 42 and 44 may be a common or same power supply rod. The first high frequency power supply 30 is configured to output a high frequency power $RF_H$ for plasma generation having a constant frequency of, for example, about 40 MHz, which mainly contributes to plasma generation. Meanwhile, the second high frequency power supply 32 outputs a high frequency power $RF_L$ for ion attraction having a constant frequency of, for example, about 13 MHz, which mainly contributes to ion attraction to the semiconductor wafer W on the susceptor 16.

Above the susceptor 16, there is provided an upper electrode 46 facing the susceptor 16 to be parallel with each other. This upper electrode 46 includes an electrode plate 48 made of a silicon-containing material, such as Si, SiC, or the like, and an electrode supporting body 50 made of a conductive material, for example, aluminum of which a surface is alumite treated. Multiple gas discharge holes 48a are formed in the electrode plate 48, and the electrode supporting body 50 is configured to detachably support the electrode plate 48. Further, the upper electrode 46 in an electrically floated state is provided at the chamber 10 via a ring-shaped insulator 52. A plasma generation space or a processing space (PS) is formed between the upper electrode 46 and the susceptor 16. The ring-shaped insulator 52 is made of, for example, alumina ($Al_2O_3$) and provided to airtightly seal a gap between an outer peripheral surface of the upper electrode 46 and a sidewall of the chamber 10, and also physically supports the upper electrode 46.

The electrode supporting body 50 includes a gas buffer room 54 therein, and includes multiple gas vent holes 50*a* communicating with the gas discharge holes 48*a* of the electrode plate 48 from a lower surface of the gas buffer room 54. The gas buffer room 54 is connected to a processing gas supply source 58 via a gas supply line 56. At the gas supply line 56, a mass flow controller (MFC) 60 and an opening/closing valve 62 are provided. After a certain processing gas (etching gas) is introduced into the gas buffer room 54 from the processing gas supply source 58, the processing gas is discharged in a shower shape into the processing space PS through the gas discharge holes 48*a* of the electrode plate 48 toward the semiconductor wafer W on the susceptor 16. As such, the upper electrode 46 serves as a shower head configured to supply the processing gas into the processing space PS.

Further, within the electrode supporting body 50, there is also formed a path (not illustrated) through which a coolant such as cooling water flows. The entire upper electrode 46, particularly, the electrode plate 48 are controlled to have a certain temperature by the coolant supplied from the external chiller unit. In order to further stabilize the temperature control with respect to the upper electrode 46, a heater (not illustrated) made of, for example, a resistance heating element may be provided within the electrode supporting body 50 or on an upper surface of the electrode supporting body 50.

This capacitively coupled plasma processing apparatus further includes an AC power supply 64 at an outside of the chamber 10. An output terminal of the AC power supply 64 is electrically connected to the upper electrode 46 via a matching unit 66, a blocking capacitor 68, and a DC power supply line or power supply rod 70. The AC power supply 64 is configured to output an AC power, and a power, a voltage peak value, or an effective value thereof is variable. The AC power has a frequency f, which ions in the plasma can follow, i.e., the AC power has a low frequency or a high frequency, which is lower than an ion plasma frequency.

Further, at an appropriate portion facing the processing space PS within the chamber 10, such as near a top portion of the inner wall member 25 or at an outer side in a radial direction of the upper electrode 46, a ring-shaped DC ground part (not illustrated) made of a conductive member such as Si, SiC, or the like is provided. This DC ground part is constantly grounded via a ground line (not illustrated). When the AC power is applied to the upper electrode 46 from the AC power supply 64 via the blocking capacitor 68 during plasma etching, a direct electric current flows between the upper electrode 46 where a self-bias voltage is generated and the DC ground part via plasma.

An annular space between the susceptor 16 and the susceptor supporting member 14 and the sidewall of the chamber 10 is formed as an exhaust space, and at a bottom portion of the exhaust space, an exhaust opening 72 of the chamber 10 is formed. This exhaust opening 72 is connected to an exhaust device 76 via an exhaust line 74. The exhaust device 76 includes a vacuum pump such as a turbo molecular pump or the like, and the inside of the chamber 10, particularly, the processing space PS can be depressurized to a desired vacuum level. Further, at the sidewall of the chamber 10, there is provided a gate valve 80 configured to open and close a loading/unloading opening 78 for the semiconductor wafer W.

A control unit 82 includes a microcomputer, and is configured to control an operation of each component in the apparatus and particularly, the high frequency power supplies 30 and 32, the AC power supply 64, the matching units 34, 36, and 66, the MFC 60, the opening/closing valve 62, the exhaust device 76, and the like, and also the whole operation (sequence) of the apparatus according to software (program) and recipe information stored in an external memory or an internal memory.

In order to perform an etching process in this capacitively coupled plasma etching apparatus, the gate valve 80 is opened first, and the semiconductor wafer W as a target to be processed is loaded into the chamber 10 and mounted on the electrostatic chuck 18. Then, a processing gas, i.e. an etching gas (typically, a mixed gas) is introduced from the processing gas supply source 58 into the chamber 10 at a certain flow rate with a flow rate ratio, and the chamber 10 is evacuated to have a preset pressure value by the exhaust device 76. Further, a first high frequency power of a certain frequency (about 40 MHz) and a second high frequency power of a certain frequency (about 13 MHz) from the first and second high frequency power supplies 30 and 32, respectively, are overlapped with each other and applied to the susceptor 16 with preset powers. Furthermore, a DC voltage is applied to the electrode 20 of the electrostatic chuck 18 from the DC power supply 22 to hold the semiconductor wafer W on the electrostatic chuck 18. The etching gas discharged from the shower head of the upper electrode 46 is electrically discharged under a high-frequency electric field between the both electrodes 46 and 16, so that plasma is generated within the processing space PS. A target film on a main surface of the semiconductor wafer W is etched with radicals or ions in the plasma.

Since the capacitively coupled plasma etching apparatus applies the first high frequency power having a relatively high frequency suitable for plasma generation to the susceptor 12, the plasma can be in a desirable dissociation state with high density, so that high-density plasma can be generated under a lower pressure. At the same time, the second high frequency power having a relatively low frequency suitable for ion attraction is applied to the susceptor 12, so that an anisotropic etching process can be performed on the target film on the semiconductor wafer W.

(Basic Operation of Upper Electrode AC Power Applying Manner in Example Embodiment)

The capacitively coupled plasma etching apparatus employs a lower electrode dual high frequency power applying structure in which dual high frequency powers $RF_H$ and $RF_L$ for plasma generation and ion attraction, respectively, are applied to the lower electrode (susceptor) 16. Further, the capacitively coupled plasma etching apparatus has a configuration and a function for an upper electrode AC power applying manner in which the AC power is applied to the upper electrode 46 via the blocking capacitor 68 from the AC power supply 64. Herein, the AC power has a frequency, which ions in the plasma can follow, i.e., the AC power has a frequency f lower than an ion plasma frequency. Further, the AC power supply 64 can vary a power, a voltage peak value, or an effective value thereof. Further, the ion plasma frequency is determined by the following Equation (1).

$$f_{pi} = (e^2 n_o / \epsilon_0 m_i)^{1/2} / 2\pi \qquad (1)$$

Herein, e denotes the electric charge of the electron, $n_o$ denotes a plasma density, $\epsilon_0$ denotes a dielectric constant in a vacuum, and $m_i$ denotes an ion mass.

By way of example, in the case of Ar ions, if a plasma density $n_o$ is $1 \times 10^9$ cm$^{-3}$, the ion plasma frequency $f_{pi}$ is about 1 MHz. If $n_o$ is $4 \times 10^9$ cm$^{-3}$, $f_{pi}$ is about 2 MHz. If $n_o$ is $1 \times 10^{10}$ cm$^{-3}$, $f_{pi}$ is about 3 MHz.

Figure 2:
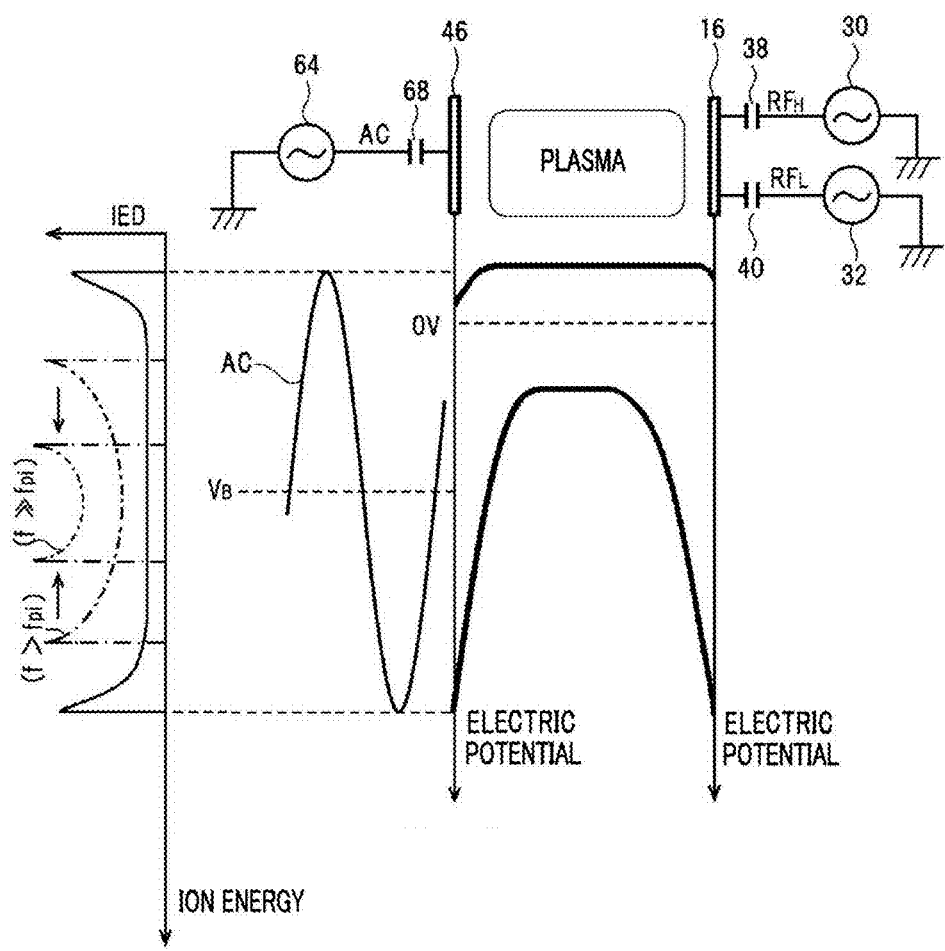
FIG. 2 shows a potential distribution between both electrodes and an ion energy distribution of ions incident to an upper electrode in an upper electrode AC power applying manner in accordance of the example embodiment.

FIG. 2 shows a potential distribution between the upper electrode 46 and the lower electrode (susceptor) 16, and an ion energy distribution of ions incident to the upper electrode 46 in the capacitively coupled plasma etching apparatus. When an AC power is applied from the AC power supply 64 to the upper electrode 46 via the blocking capacitor 68 during an etching process, a negative DC voltage, i.e. a self-bias voltage $V_B$ is generated at the upper electrode 46, and the self-bias voltage $V_B$ is overlapped with an AC voltage (instantaneous value). Herein, since the frequency f of the AC power is lower than the ion plasma frequency $f_{pi}$ and an electron temperature near the upper electrode 46 is low, the self-bias voltage $V_B$ has a value close to the AC voltage peak value. As such, an electric potential of the upper electrode 46 is cyclically changed since the self-bias voltage $V_B$ is overlapped with the voltage level (instantaneous value).

Meanwhile, ions of positive electric charges in the plasma are accelerated by an electric field within a sheath according to the electric potential of the upper electrode 46 and incident to the upper electrode 46. Energy of the ions incident to the upper electrode 46 is proportional to a depth (absolute value) in a direction of a negative electric potential of the upper electrode 46 and is cyclically changed. Therefore, during each cycle, when the AC voltage level has the minimum value, the ion energy has the maximum value, whereas when the AC voltage level has the maximum value, the ion energy has the minimum value. In this case, as for an ion energy distribution IED, since a lot of ions are incident to the electrode in a time range (near the maximum or minimum level) in which a voltage change over time is small, a lot of ions are distributed near the maximum ion energy level or the minimum ion energy level. According to the upper electrode AC power applying manner of the example embodiment, whenever the AC voltage level has the minimum value during each cycle, a lot of ions having the maximum ion energy corresponding to the maximum negative electric potential as the sum of the self-bias voltage $V_B$ and the AC voltage peak value are incident to the upper electrode 46.

Further, if the frequency f of the AC power is higher than the ion plasma frequency $f_{pi}$, a follow-up property of the ions is decreased. Further, as the frequency f of the AC power is increased, a width of an energy band in the ion energy distribution IED is narrowed as shown in FIG. 2. That is, a deviation of the ion energy is decreased and the ion energy is distributed almost near a central value corresponding to the self-bias voltage $V_B$. Thus, the maximum value of the ion energy is decreased.

Figure 3:
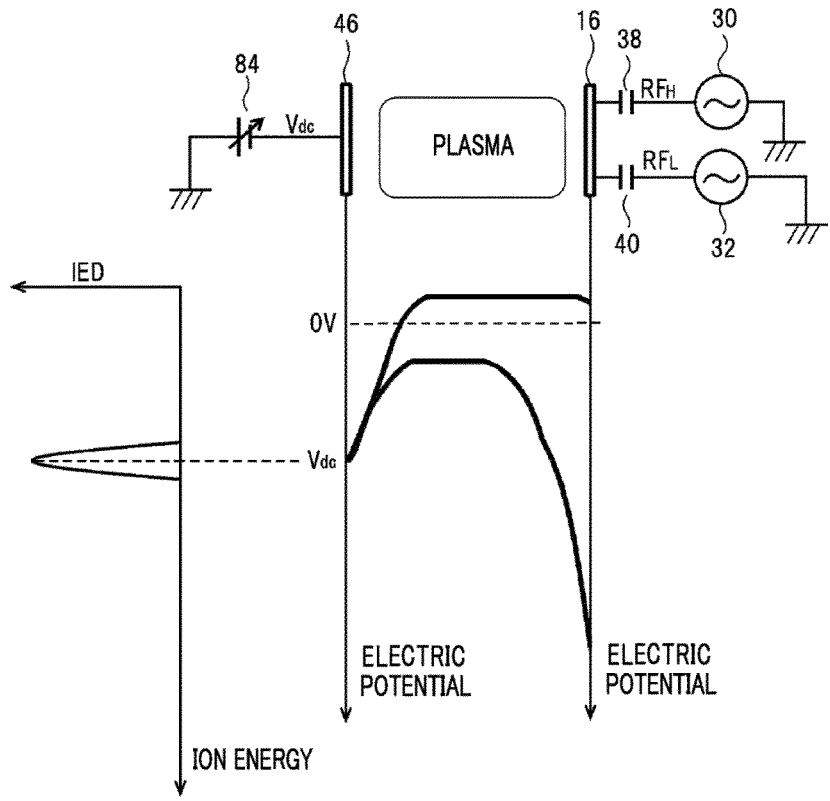
FIG. 3 shows a potential distribution between both electrodes and an ion energy distribution of ions incident to an upper electrode in an upper electrode DC power applying manner in accordance of a comparative example.

FIG. 3 shows a potential distribution when a negative DC voltage $V_{dc}$ is applied to the upper electrode 46 by a DC power supply 84 and an ion energy distribution of ions incident to the upper electrode 46 according to the conventional upper electrode DC power applying manner as a comparative example of the upper electrode AC power applying manner. In this case, an ion energy distribution IED has a profile in which energy of all incident ions are included in an energy band of a very narrow width corresponding to the DC voltage $V_{dc}$. Therefore, during a plasma process, ions that are normally included in a uniform narrow energy band are incident to the upper electrode 46 at a substantially uniform rate.

Figure 4:
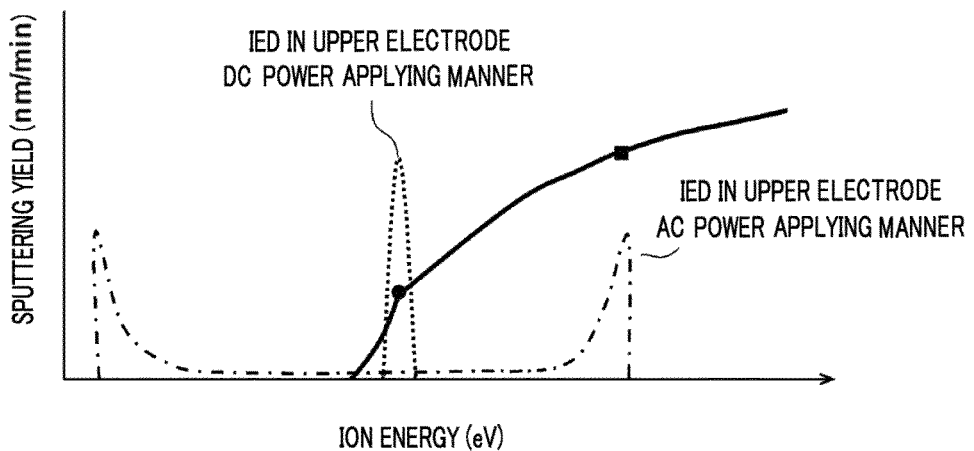
FIG. 4 shows a correlation between ion energy and a sputtering yield.

Typically, there is a relationship of $SY \propto E_i^{1/2}$ between ion energy ($E_i$) and a sputtering yield (SY). Therefore, as shown in FIG. 4, the sputtering yield largely depends on the magnitude (maximum value) of the ion energy rather than the number of incident ions. In this regard, even if amplitudes or absolute values of a power supply voltage applied to the upper electrode 46 are the same, since ions having higher energy are incident to the upper electrode 46 in the upper electrode AC power applying manner of the example embodiment as compared with the upper electrode DC power applying manner, the upper electrode AC power applying manner of the example embodiment can improve a sputtering yield at the upper electrode 46 with more efficiency.

Further, according to the upper electrode DC power applying manner, since an electric potential of the upper electrode 46 is maintained to the negative DC voltage $V_{dc}$, a plasma potential is decrease to be low. In this regard, according to the upper electrode AC power applying manner of the example embodiment, in a half cycle where an AC voltage level has a positive value, the potential of the upper electrode 46 is higher than the self-bias voltage $V_B$, so that a plasma potential is increased accordingly. In particular, near the AC voltage level having the maximum value, a plasma potential near the sidewall of the chamber is increased to a considerably high value.

As such, according to the upper electrode AC power applying manner of the example embodiment, as compared with the upper electrode DC power applying manner, a plasma potential near the sidewall of the chamber 10 is considerably high in a time-average manner and ion energy of ions incident to the sidewall of the chamber 10 from the plasma is remarkably increased. Thus, the sputtering effect of removing deposits attached to the chamber sidewall can be improved, and the deposits on the chamber sidewall can be efficiently removed. Therefore, reproducibility of the process and mass productivity of the apparatus can be improved.

(Experimental Example Regarding HARC Process)

Figure 5A:
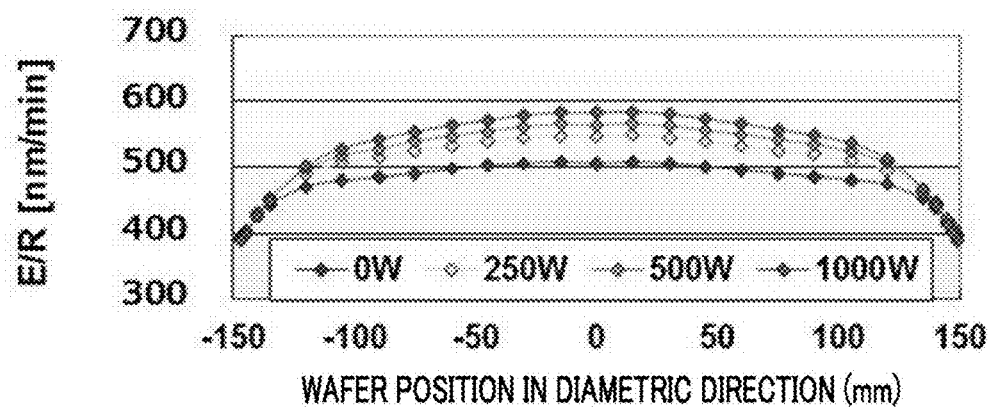
FIG. 5A shows a wafer in-plane distribution of etching rates of a silicon oxide film obtained from a HARC process experiment to which the upper electrode AC power applying manner is applied.
Figure 5B:
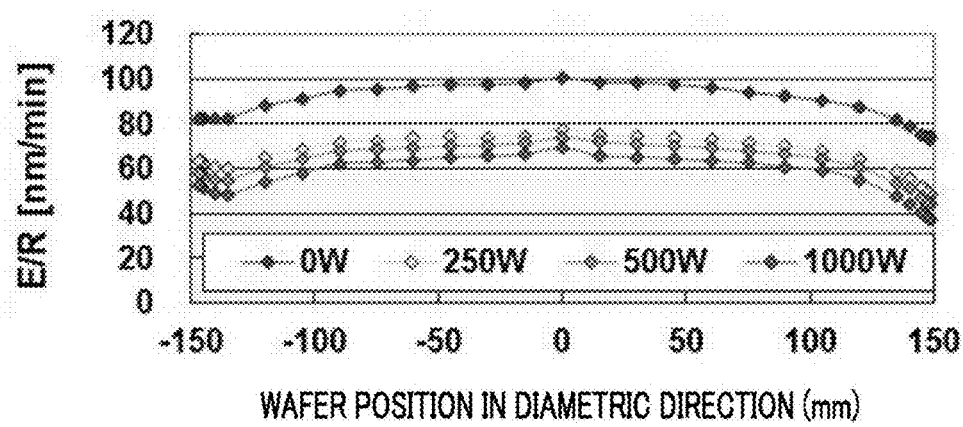
FIG. 5B shows a wafer in-plane distribution of etching rates of a photoresist obtained from the HARC process experiment to which the upper electrode AC power applying manner is applied.
Figure 6A:
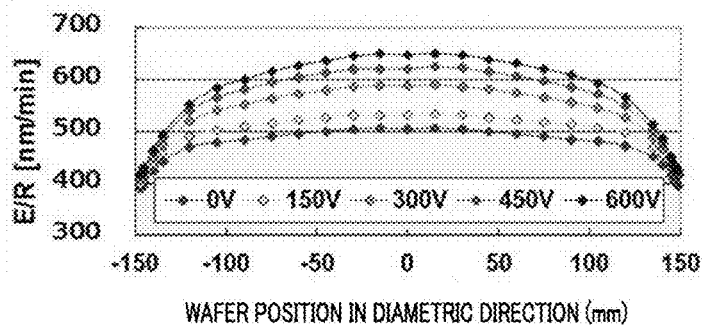
FIG. 6A shows a wafer in-plane distribution of etching rates of a silicon oxide film obtained from a HARC process experiment to which the upper electrode DC power applying manner is applied.
Figure 6B:
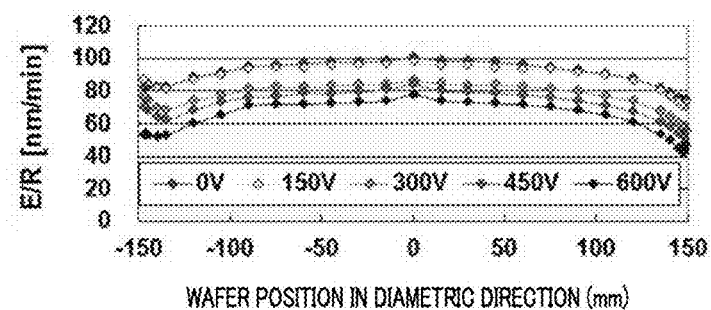
FIG. 6B shows a wafer in-plane distribution of etching rates of a photoresist obtained from the HARC process experiment to which the upper electrode DC power applying manner is applied.

The present inventors conducts an experiment for comparing the upper electrode AC power applying manner of the example embodiment and the conventional upper electrode DC power applying manner in a HARC process by using a plasma etching apparatus (FIG. 1) of the present example embodiment. In FIG. 5A and FIG. 5B, wafer in-plane distributions of etching rates (E/R) of a silicon oxide film (etching target film) and a photoresist (mask) are shown as experimental results of the upper electrode AC power applying manner, respectively. In FIG. 6A and FIG. 6B, wafer in-plane distributions of etching rates (E/R) of a silicon oxide film and a photoresist are shown as experimental results of the upper electrode DC power applying manner, respectively. Principal process conditions of the HARC process experiment are as follows.

Resist: ArF resist for acrylate base

Processing gas: $C_4F_6/C_4F_8/Ar/O_2$=about 20/about 35/about 500/about 36 sccm Pressure within chamber: about 20 mTorr Temperature: Upper electrode/chamber sidewall/lower electrode=about 60/about 60/about 40° C.

High frequency power: about 40 MHz/about 13 MHz=about 1000/about 4500 W

AC power frequency: AC=about 380 kHz

AC power: AC=about 0 W, about 250 W, about 500 W, about 1000 W

DC voltage: $V_{dc}$=about 0 V, about −150 V, about −300 V, about −450 V, about −600 V As shown in FIG. 5B and FIG. 6B, the upper electrode AC power applying manner and the upper electrode DC power applying manner are not much different in etching rate distribution of the photoresist (PR), and each has a low and flat profile. That is, to enhance plasma resistance of the photoresist (PR), in the HARC process, the upper electrode AC power applying manner sufficiently has the above-described effects (1) and (3), and the upper electrode DC power applying manner also has the above-described effects (1) and (3) to be equivalent to those of the upper electrode AC power applying manner.

However, as shown in FIG. 5A and FIG. 6A, the profiles of the both manners are clearly different in etching rate distribution of the silicon oxide film ($SiO_2$). That is, in the profile of the upper electrode DC power applying manner, as an absolute value of a DC voltage $V_{dc}$ is increased, a difference between an etching rate at a central portion of the wafer and an etching rate at an edge portion of the wafer is increased, and an etching rate at the central portion of the wafer becomes remarkably increased. In short, as an application voltage (absolute value) is increased in the upper electrode DC power applying manner, in-plane uniformity in etching rates of $SiO_2$ is deteriorated. In this regard, in the profile of the upper electrode AC power applying manner, as the AC power is increased, a difference between an etching rate at a central portion of the wafer and an etching rate at an edge portion of the wafer is increased, but an etching rate at the central portion of the wafer does not become remarkably high as compared with the upper electrode DC power applying manner. That is, in-plane uniformity in etching rates of $SiO_2$ is improved.

As such, a difference in in-plane uniformity in etching rates of $SiO_2$ in the HARC process of the upper electrode DC power applying manner and the upper electrode AC power applying manner may be caused by a difference in the effect (6). That is, it is deemed that in the upper electrode DC power applying manner, by increasing an absolute value of the DC voltage $V_{dc}$, the effect (6) is unwillingly strengthened, whereas in the upper electrode AC power applying manner, even if the AC power is increased, the effect (6) is not as strong as that of the upper electrode DC power applying manner.

Figure 7:
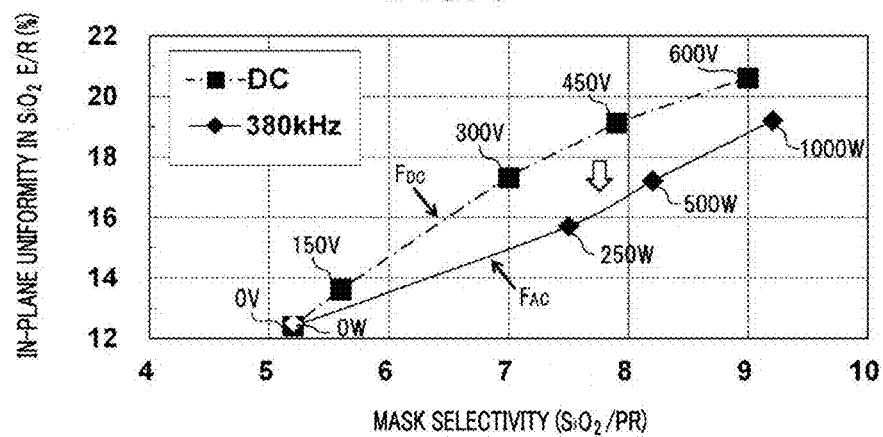
FIG. 7 is a plot diagram showing correlations between mask selectivity and etching rate in-plane uniformity in the upper electrode AC power applying manner and the upper electrode DC power applying manner.

In the HARC process experiment, a correlation $F_{AC}$ between mask selectivity and in-plane uniformity in etching rates of $SiO_2$ in the upper electrode AC power applying manner is obtained from etching characteristics of an oxide film as shown in FIG. 5A and etching characteristics of a resist as shown in FIG. 5B by using the AC power as a parameter. Further, a correlation $F_{DC}$ between mask selectivity and in-plane uniformity in etching rates of $SiO_2$ in the upper electrode DC power applying manner is obtained from etching characteristics of an oxide film as shown in FIG. 6A and etching characteristics of a resist as shown in FIG. 6B by using the voltage value (absolute value) of the DC voltage $V_{dc}$ as a parameter. FIG. 7 provides a plot diagram comparatively showing the correlations $F_{AC}$ and $F_{DC}$.

As shown in the plasma etching apparatus in the present example embodiment, when two high frequency powers $RF_H$ and $RF_L$ for plasma generation and ion attraction, respectively, are applied to the lower electrode (susceptor) 16, the high frequency powers $RF_H$ and $RF_L$ serve as a principal control knob (first control knob), so that etching rate characteristics can be controlled. Meanwhile, as for selectivity, each of a voltage value (absolute value) of the DC voltage $V_{dc}$ in the upper electrode DC power applying manner and the AC power (or a voltage peak value, an effective value of the AC power or the like) in the upper electrode AC power applying manner may serve as a control knob (second control knob). Herein, in order to optimize the etching rate characteristics and selectivity at the same time, desirably, the first control knob may be as independent as possible of the second control knob. Therefore, when mask selectivity is changed by using the second control knob, even if the etching rate characteristic (for example, in-plane uniformity) is affected and changed by such a change, desirably, a variation may be as small as possible. In terms of independence between the first control knob and the second control knob, it can be seen that the upper electrode AC power applying manner is better than the upper electrode DC power applying manner as shown in FIG. 7.

Figure 9:
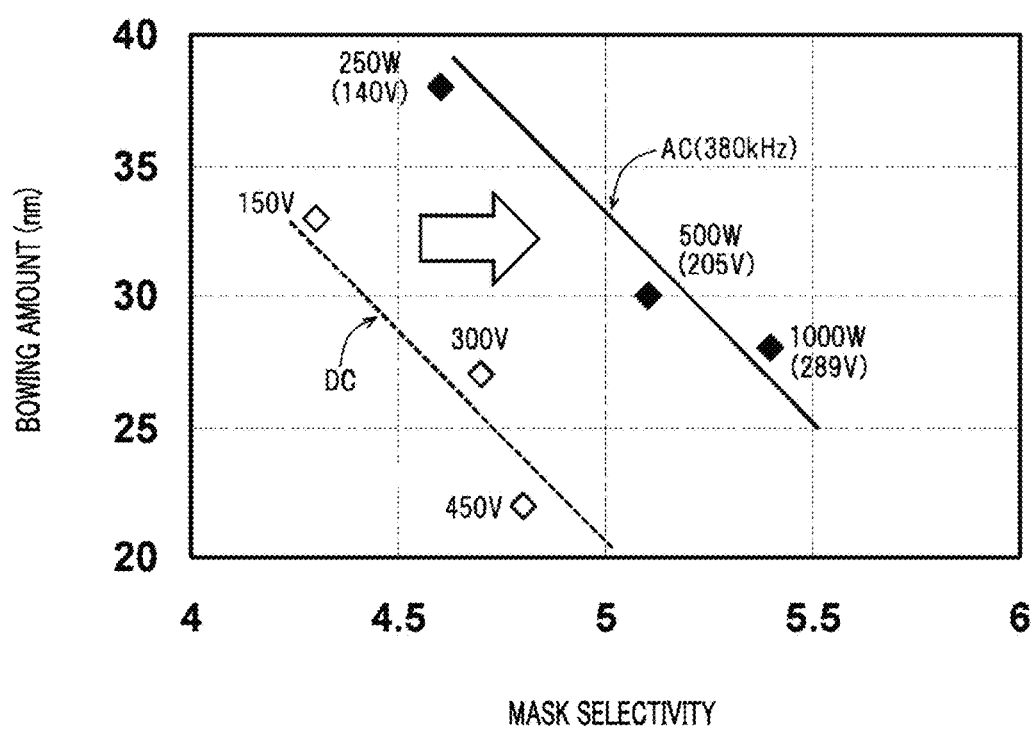
FIG. 9 shows correlations between mask selectivity and a bowing amount in the upper electrode AC power applying manner and the upper electrode DC power applying manner.

In the HARC process experiment, etching profiles are also analyzed. FIG. 8 shows SEM images used for measuring etching profiles. FIG. 9 shows correlations between mask selectivity and a bowing amount by comparing the upper electrode AC power applying manner with the upper electrode DC power applying manner. The bowing amount refers to a difference between the maximum diameter (bowing CD) and the uppermost diameter (top CD) within a fine hole formed in a silicon oxide film. As the bowing amount is decreased, a vertical process profile is improved.

As shown in FIG. 8, in the upper electrode DC power applying manner, as the absolute value of the DC voltage $V_{dc}$ is increased, both the mask selectivity and the bowing amount are improved. Further, in the upper electrode AC power applying manner, as the AC power is increased, both the mask selectivity and the bowing amount are improved. However, as shown in FIG. 9, when the bowing amounts are the same, the upper electrode AC power applying manner obtains higher mask selectivity than the upper electrode DC power applying manner. That is, to obtain both of an etching profile and mask selectivity, the upper electrode AC power applying manner is better than the upper electrode DC power applying manner.

(Example Regarding BEOL Process)

The present inventors conducts two experiments for comparing the upper electrode AC power applying manner of the example embodiments and the conventional upper electrode DC power applying manner in a BEOL process by using a plasma etching apparatus (FIG. 1) of the present example embodiment. The BEOL process is a technology of forming a relatively shallow via hole in an interlayer insulating film by plasma etching in a wiring forming process for manufacturing a LSI. Recently, an organic low-k film has been wieldy used as an interlayer insulating film of a target object.

In the BEOL process experiments, as shown in FIG. 10A and FIG. 10B, a semiconductor wafer W formed by stacking a SiC film 90 as an underlying layer or an etching stop layer, two organic low-k films 92 and 94 as an etching target material, a TEOS film 96 as a hard mask, and a photoresist 98 as an uppermost pattern mask in sequence from the bottom is used as a target substrate. As the organic low-k films 92 and 94, a SiOC-based organic film containing Si, O, C, and H is used. Further, as shown in FIG. 10A, prior to the experiments, a hole 100 is formed in advance to a depth in the middle of the TEOS film 96 by plasma etching in a pre-process. Further, as shown in FIG. 10B, the etching hole 100 is formed to be close to the bottom of the underlying low-k film 92 by the first and second experiments.

In this kind of BEOL process, it is important not to damage an organic low-k film which is apt to be physically and chemically damaged. For this reason, damage amounts of the organic low-k films 92 and 94 are included in the measurement items of the first and second experiments. When a SiOC-based organic film is damaged by plasma etching, a composition of the damaged portion is changed to SiO and the damaged portion is dissolved by a HF solution. Therefore, after the etching, a semiconductor wafer of the sample is immersed in the HF solution for about 30 seconds, and an amount of inner walls cut from the organic low-k films 92 and 94 (increase amount of bowing CD) within the etching hole 100 is measured as a low-k damage amount.

In the first experiment, the first and second high frequency powers $RF_H$ and $RF_L$ to be applied to the lower electrode (susceptor) 16 are set to be about 630 W and about 160 W, respectively. In the second experiment, the electron density (Ne) and the self-bias voltage ($V_L$) (lower electrode $V_L$) of the lower electrode (susceptor) 16 are set to be about $4 \times 10^{10}$ cm$^{-3}$ and about 300 V, respectively. The other process conditions are the same in the first and second experiments as follows.

Processing gas: $C_4F_3/Ar/N_2/O_2$=about 30/about 1200/about 70/about 17 sccm

Pressure within chamber: about 80 mTorr

Temperature: Upper electrode/chamber sidewall/lower electrode=about 60/about 60/about 60° C.

AC power frequency: AC=about 380 kHz

AC power: AC=about 0 W, about 250 W, about 500 W

DC voltage: $V_{dc}$=about 0 V, about −300 V, about −700 V

FIG. 11 shows cross sectional views (SEM images) of patterns obtained from the first experiment of the BEOL process and measurement values of measurement items. As shown in FIG. 11, a top CD is decreased and a low-k damage amount is increased as the absolute value of the DC voltage $V_{dc}$ is increased in the upper electrode DC power applying manner and as the AC power is increased in the upper electrode AC power applying manner. In particular, in a high voltage (high power) range, this tendency is stronger in the upper electrode AC power applying manner than in the upper electrode DC power applying manner.

However, the low-k damage amount allowable in this kind of BEOL process is about 5 nm or less. Therefore, the both manners use a low voltage (low power) range. By way of example, in the upper electrode DC power applying manner, if the $V_{dc}$ is about −300 V, the low-k damage amount is about 4 nm. In this case, the etching depth is about 160 nm, the top CD is about 47 nm, and the bowing CD is about 49 nm. Meanwhile, in the upper electrode AC power applying manner, if the AC power is about 250 W, the low-k damage amount is about 5 nm. In this case, the etching depth is about 150 nm, the top CD is about 46 nm, and the bowing CD is about 46 nm. As such, according to the experimental results of the first experiment, it can be seen that in the BEOL process using an organic low-k film as an etching target film, there is no substantial difference between the upper electrode AC power applying manner of the example embodiment and the conventional upper electrode DC power applying manner.

FIG. 12 shows cross sectional views (SEM images) of patterns obtained from the second experiment of the BEOL process and measurement values of measurement items. Even in the second experiment, as shown in FIG. 12, the top CD is decreased and the low-k damage amount is increased as the absolute value of the DC voltage $V_{dc}$ is increased in the upper electrode DC power applying manner and as the AC power is increased in the upper electrode AC power applying manner. In terms of the low voltage range (low power range) where the low-k damage amount becomes a tolerance (about 5 nm or less), in the upper electrode DC power applying manner, if the $V_{dc}$ is about −300 V at which the low-k damage amount is about 2 nm, the etching depth is about 155 nm, the top CD is about 51 nm, and the bowing CD is about 51 nm. Meanwhile, in the upper electrode AC power applying manner, if the AC power is about 250 W at which the low-k damage amount is about 5 nm, the etching depth is about 150 nm, the top CD is about 46 nm, and the bowing CD is about 46 nm. As such, it can be seen that even in the second experiment, there is no substantial difference between the upper electrode AC power applying manner of the example embodiment and the conventional upper electrode DC power applying manner.

Figure 13:
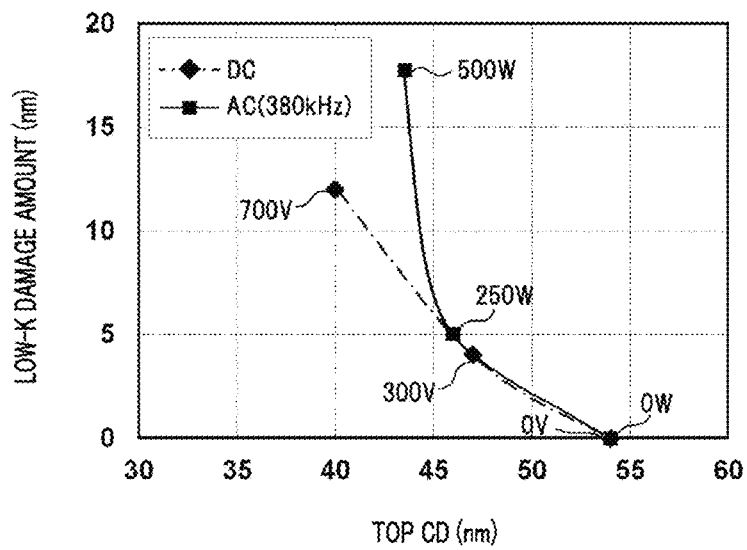
FIG. 13 is a plot diagram showing correlations between a top CD and a low-k damage amount obtained from a result of the first experiment.
Figure 14:
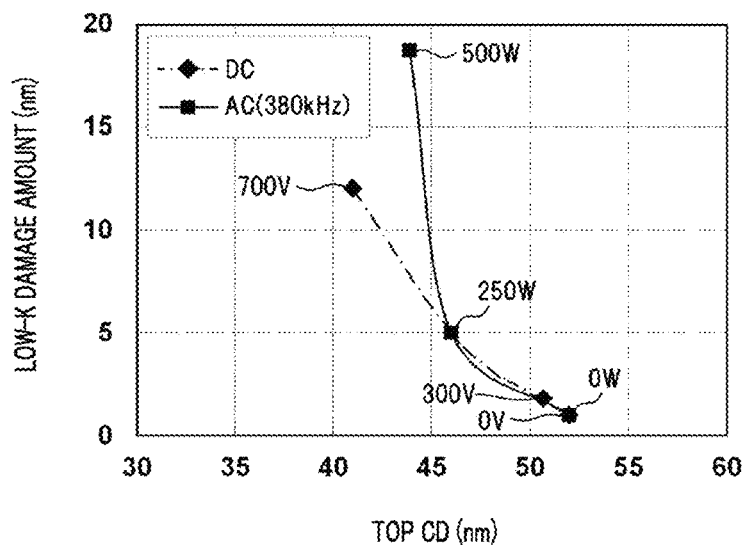
FIG. 14 is a plot diagram showing correlations between a top CD and a low-k damage amount obtained from a result of the second experiment.

FIG. 13 and FIG. 14 respectively show correlations (plot diagrams) between the top CD and the low-k damage amount obtained from the results of the first and second experiments. It can be seen from these correlations that in a range where the low-k damage amount becomes a tolerance (about 5 nm or less), there is no substantial difference in the top CD between the upper electrode AC power applying manner of the example embodiment and the conventional upper electrode DC power applying manner. Further, a case of the AC power=0 W in the upper electrode AC power applying manner corresponds to a case of the DC voltage $V_{dc}$=0 V in the upper electrode DC power applying manner.

OTHER EXPERIMENTAL EXAMPLES

Figure 15:
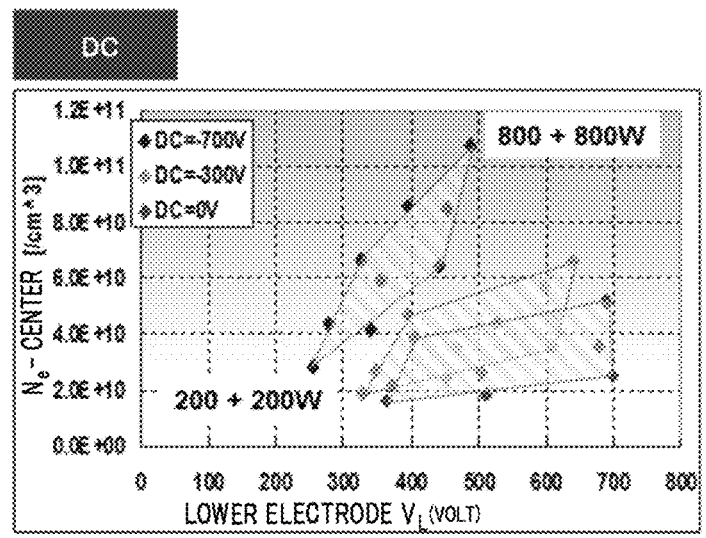
FIG. 15 shows correlations ($N_e$—lower electrode $V_L$ characteristics) between an electron density ($N_e$) within a processing space and a self-bias voltage ($V_L$) generated at a lower electrode in the upper electrode DC power applying manner.
Figure 16:
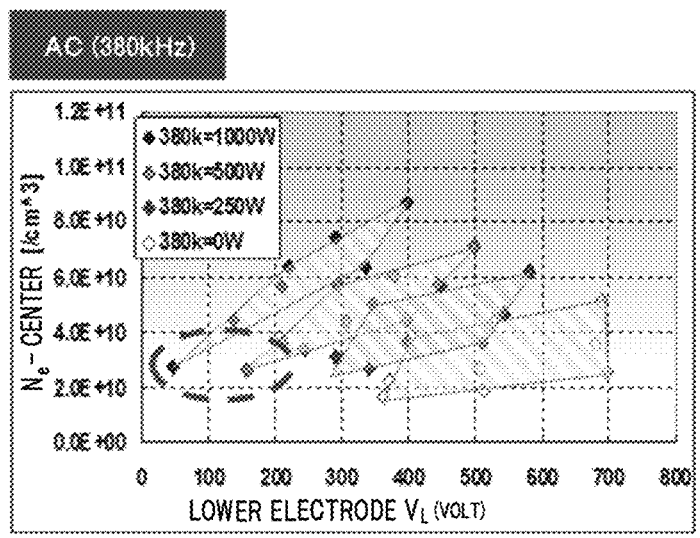
FIG. 16 shows correlations ($N_e$—lower electrode $V_L$ characteristics) between an electron density ($N_e$) within a processing space and a self-bias voltage ($V_L$) generated at a lower electrode in the upper electrode AC power applying manner.

The present inventors conduct other plasma etching experiments with the upper electrode DC power applying manner and the upper electrode AC power applying manner under the same process conditions as those of the first experiment of the BEOL process using the first and second high frequency powers $RF_H$ and $RF_L$ as parameters ($RF_H$, $RF_L$=about 200, about 400, about 800 W). Then, based on experimental results thereof, as shown in FIG. 15 and FIG. 16, correlations, i.e. $N_e$—lower electrode $V_L$ characteristics, between an electron density (plasma density) ($N_e$) within the processing space (PS) and a self-bias voltage ($V_L$) (lower electrode $V_L$) generated at the lower electrode 16 are obtained.

According to comparison between the $N_e$—lower electrode $V_L$ characteristics (FIG. 15) of the upper electrode DC power applying manner and the $N_e$—lower electrode $V_L$ characteristics (FIG. 16) of the upper electrode AC power applying manner, it can be seen that the upper electrode AC power applying manner can expand a process margin to a lower electrode $N_e$—lower electrode $V_L$ range. Further, the lower electrode $N_e$—lower electrode $V_L$ range is suitable for, for example, a process of etching an insulating thin film of a MRAM (Magnetoresistive Random Access Memory) at a low speed.

Further, the present inventors conduct other plasma etching experiments under the same process conditions as those of first experiment of the BEOL process except that the AC power is variable from about 0 W to about 100 W, about 125 W, about 250 W, and about 500 W in the upper electrode AC power applying manner and the absolute value of the DC voltage $V_{dc}$ is variable from about 0 V to about 150 V and about 300 V in the upper electrode DC power applying manner. During each experiment, a plasma potential near the sidewall of the chamber 10 is measured for each parameter.

Figure 17:
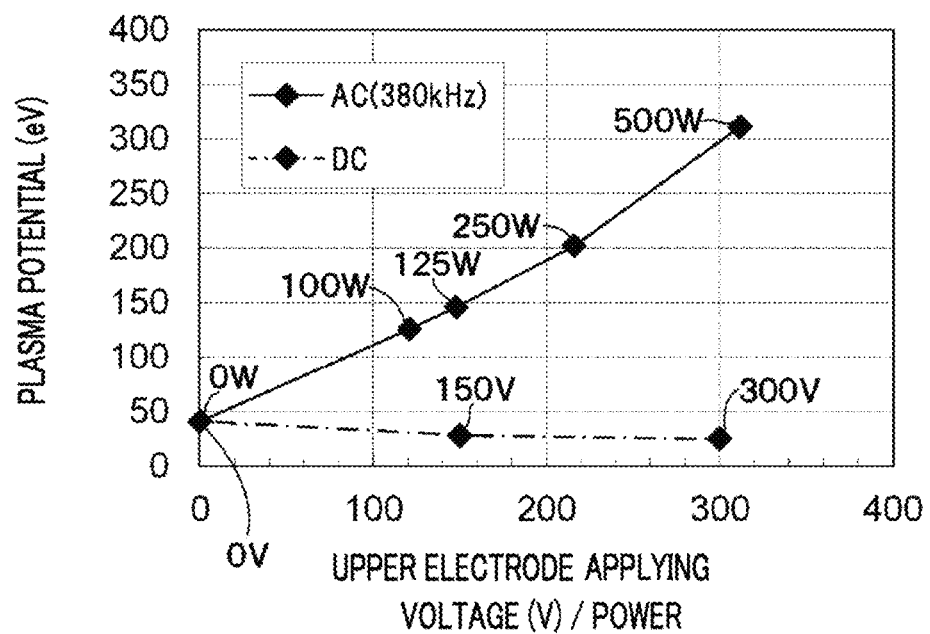
FIG. 17 is a plot diagram showing correlations between an upper electrode applying voltage or power and a plasma potential obtained from an experiment in accordance with an experimental example.

FIG. 17 shows experimental results thereof. As shown in FIG. 17, it is found that according to the upper electrode DC power applying manner, as the absolute value of the DC voltage $V_{dc}$ is increased, the plasma potential near the chamber sidewall is decreased, whereas according to the upper electrode AC power applying manner, as the AC power is increased, the plasma potential near the chamber sidewall is increased. This is because according to the upper electrode DC power applying manner, the electric potential of the upper electrode 46 is set to be the negative DC voltage $V_{dc}$ and a plasma potential is decreased, as described above. Meanwhile, according to the upper electrode AC power applying manner, in a half cycle where the AC voltage level has a positive value, the electric potential of the upper electrode 46 is higher than the self-bias voltage $V_B$, so that the plasma potential is increased accordingly. Therefore, the plasma potential near the chamber sidewall is increased in a time-average manner.

The present inventors conduct an experiment for comparing the upper electrode AC power applying manner of the example embodiment and the conventional upper electrode DC power applying manner in terms of the effect of modifying (reforming) an ArF resist as an etching mask under plasma. Principal process conditions of the experiment are as follows.

Processing gas: $H_2$/Ar=about 100/about 800 sccm
Pressure within chamber: about 50 mTorr
Temperature: Upper electrode/chamber sidewall/lower electrode=about 60/about 60/about 30° C.
High frequency power: about 40 MHz/about 13 MHz=about 300/about 0 W
AC power frequency: AC=about 380 kHz
AC power: AC=about 0 W, about 250 W, about 500 W
DC voltage: $V_{dc}$=about 0 V, about −300 V, about −700 V
Processing time: about 30 seconds FIG. 18 provides SEM images showing experimental results of the ArF resist modifying process. As shown in FIG. 18, in the case of using the upper electrode DC power applying manner, a thickness of a modification layer is about 16.7 nm, about 21.4 nm, and about 40.8 nm when $V_{dc}$ is about 0 V, about −300 V, and about −700 V, respectively. Meanwhile, in the case of using the upper electrode AC power applying manner, a thickness of a modification layer is about 16.7 nm, about 26.6 nm, and about 50.6 nm when the AC power is about 0 W, about 250 W, and about 500 W, respectively. As such, it can be seen that the thickness of the modification layer is increased as the absolute value of the DC voltage $V_{dc}$ is increased in the upper electrode DC power applying manner and as the AC power is increased in the upper electrode AC power applying manner, and the both manners are not much different in the increasing rate thereof.

As described above, the upper electrode AC power applying manner of the example embodiment can maintain advantages of the conventional upper electrode DC power applying manner in terms of, for example, a BEOL process or the effect of modifying a ArF resist and can also remove disadvantages of the upper electrode DC power applying manner in terms of, for example, a HARC process.

Although the example embodiment has been explained above, the present embodiment is not limited thereto and can be changed and modified in various ways within a scope of the technical conception.

By way of example, a value (about 380 kHz) of the frequency f of the AC power in the experimental example is an example, and a certain value of the frequency f which ions can follow may be used for the frequency of the AC power. Therefore, as the frequency f of the AC power may be higher than about 380 kHz in the above-described example embodiment or may use a frequency band to about 13 MHz which is considered as a limit to a frequency which ions can typically follow (a frequency which can apply energy to ions in a different view).

Further, in the above-described example embodiment, the matching unit 66 is used in order to apply the AC power outputted from the AC power supply 64 to the upper electrode 46 at the maximum power transmission efficiency, but the matching unit 66 may be omitted. Furthermore, the second high frequency power $RF_L$ may not be applied to the lower electrode (susceptor) 16, i.e. the high frequency power supply 32, the matching unit 36, and the blocking capacitor 40 may be omitted. Besides, the shower head configuration in the upper electrode 46 may be randomly changed.

The example embodiment is not limited to the capacitively coupled plasma etching apparatus and can be applied to a capacitively coupled plasma processing apparatus that performs a certain plasma process such as plasma CVD, plasma ALD, plasma oxidation, plasma nitrification, sputtering, and the like. The target substrate in the example embodiment is not limited to the semiconductor wafer, and a flat panel display, organic EL, various substrates for solar cell, or a photo mask, a CD substrate, a print substrate, and the like may be used.

EXPLANATION OF REFERENCE NUMERALS

10: Chamber
16: Susceptor (lower electrode)
30: High frequency power supply (for plasma generation)
32: High frequency power supply (for ion attraction)
46: Upper electrode
58: Processing gas supply source
64: AC power supply
68: Blocking capacitor
82: Control unit

We claim:

1. A plasma etching method of forming a hole of a high aspect ratio in a silicon oxide film on a target substrate, the target substrate including a mask, the plasma etching method comprising:
   mounting and supporting the target substrate on a first electrode within a processing chamber in which the first electrode is provided to be parallel with a second electrode with a preset gap, a base material of the second electrode containing silicon or SiC;
   vacuum exhausting an inside of the processing chamber to a preset pressure;
   generating plasma of a fluorocarbon-based etching gas in a processing space between the first electrode and the second electrode by supplying the etching gas into the processing space and applying a first high frequency power to the first electrode;
   applying a low frequency AC power or a high frequency AC power having a frequency, which an ion in the plasma is allowed to follow, to the second electrode via a blocking capacitor; and
   increasing an effective voltage value of the AC power to enhance sputtering at the second electrode by increasing an absolute value of a self-bias voltage of the second electrode such that silicon sputtered from the base material of the second electrode reacts with fluorine radicals generated from the fluorocarbon-based etching gas to produce a reaction product of $SiF_4$, to irradiate electrons generated near the second electrode to the target substrate and to increase a plasma potential near a sidewall of the processing chamber,
   wherein mask selectivity of the mask is controlled by controlling the effective voltage value of the AC power.

2. The plasma etching method of claim 1,
   wherein a second high frequency power having a frequency for ion attraction is applied to the first electrode.

3. The plasma etching method of claim 1,
   wherein the etching gas contains a fluorocarbon gas, an argon gas, and an oxygen gas.

* * * * *